US007516471B2

(12) United States Patent
Visotsky et al.

(10) Patent No.: US 7,516,471 B2

(45) Date of Patent: Apr. 7, 2009

(54) DETECTOR FOR DIGITAL TELEVISION SIGNAL

(75) Inventors: Eugene Visotsky, Vernon Hills, IL (US); Stephen L. Kuffner, Algonquin, IL (US); Roger L. Peterson, Inverness, IL (US)

(73) Assignee: Motorola, Inc., Schaumburg, IL (US)

( * ) Notice: Subject to any disclaimer, the term of this patent is extended or adjusted under 35 U.S.C. 154(b) by 576 days.

(21) Appl. No.: 11/325,048

(22) Filed: Jan. 4, 2006

(65) Prior Publication Data

US 2007/0157269 A1 Jul. 5, 2007

(51) Int. Cl.

| | |
|---|---|
| ***H04N 7/20*** | (2006.01) |
| ***H04N 7/173*** | (2006.01) |
| ***H04N 7/16*** | (2006.01) |
| ***H04J 1/16*** | (2006.01) |
| ***H04W 4/00*** | (2006.01) |
| ***H04N 5/44*** | (2006.01) |
| ***H04L 27/00*** | (2006.01) |
| ***H03K 9/00*** | (2006.01) |

(52) U.S. Cl. ......................... 725/70; 725/100; 725/107; 725/131; 725/138; 725/139; 725/82; 370/252; 370/338; 348/725; 375/295; 375/316

(58) Field of Classification Search ................. 725/100, 725/107, 131, 138–139, 82; 370/252, 338; 348/725; 375/295, 316

See application file for complete search history.

(56) References Cited

U.S. PATENT DOCUMENTS

| | | | | |
|---|---|---|---|---|
| 4,092,594 | A * | 5/1978 | Baker | 455/154.2 |
| 4,419,765 | A | 12/1983 | Wycoff et al. | |
| 4,991,169 | A * | 2/1991 | Davis et al. | 370/463 |
| 5,636,252 | A * | 6/1997 | Patel et al. | 375/345 |
| 5,970,390 | A * | 10/1999 | Koga et al. | 455/42 |
| 6,313,882 | B1 * | 11/2001 | Limberg et al. | 348/614 |
| 7,219,367 | B2 * | 5/2007 | Briggs | 725/139 |

OTHER PUBLICATIONS

Authors: Reed, D.E.; Wickert, M.A. Title: Symbol rate detectability of filtered OQPSK by a delay and multiply receiver Date: Mar. 16-18, 1988 at Computers and Communications, 1988 Conference Proceedings. pp. 174-178; Publisher: IEEE CNF.*

* cited by examiner

*Primary Examiner*—John W Miller
*Assistant Examiner*—Gigi Dubasky

(57) ABSTRACT

A DTV signal detector detects DTV signals received by a receiver on a selected DTV channel in a Digital Television System. The DTV detector includes a first DTV signal detector that detects a first characteristic of the received DTV signals, and a second DTV signal detector that detects at least a second characteristic of the received DTV signals. A controller responds to the first DTV signal detector and the second DTV signal detector to control a selection of the DTV channel being selected by the receiver. The receiver can be synthesized to select from more than one DTV channel.

10 Claims, 6 Drawing Sheets

300

600

DETECTOR FOR DIGITAL TELEVISION SIGNAL

BACKGROUND

A number of proposals have been made to allow the use of TV spectrum by unlicensed devices, provided that the unlicensed users do not create harmful interference to the incumbent users of the spectrum. It is envisioned that these unlicensed devices will possess the capability to autonomously identify channels within licensed television bands where they may transmit without creating harmful interference. Pilot detectors have been proposed to determine the presence of an active television channel. However, there are a number of problems associated with the detection and identification of licensed Digital Television (DTV) transmissions for the purpose of determining whether or not an unlicensed device can share a particular television channel. Since the DTV signal includes a strong pilot tone (relative to the power spectral density of the DTV signal) it has been used for detection of DTV transmissions in AWGN channels. However, in frequency selective fading channels, a frequency null can occur at the pilot signal frequency, leading a pilot detector to erroneously conclude that the channel is not utilized by a licensed TV service. As a result the unlicensed device could begin transmitting on an active television channel, causing interference to users in close proximity to the device.

BRIEF DESCRIPTION OF THE DRAWINGS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description, like reference numerals are used to describe the same, similar or corresponding parts in the several views of the drawings.

DETAILED DESCRIPTION

Figure 1:
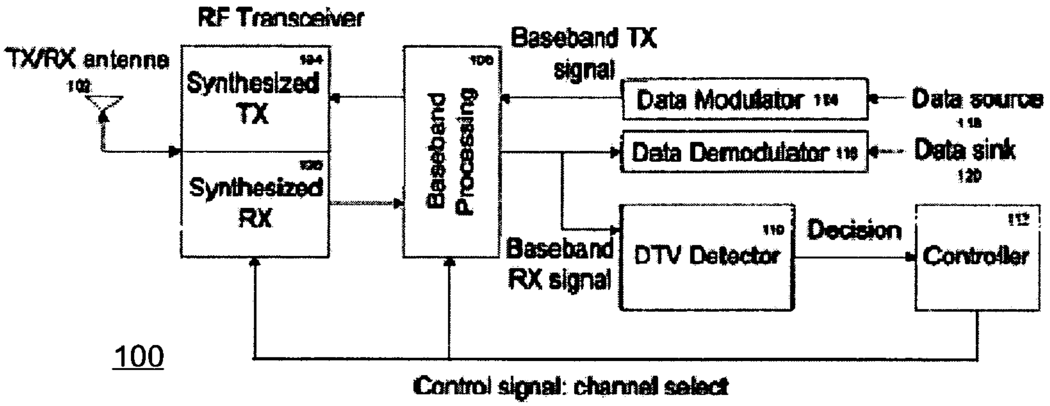
FIG. 1 is an electrical block diagram of a transceiver utilizing various embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

FIG. 1 is an electrical block diagram of a radio frequency (RF) transceiver 100 utilizing embodiments of the present invention. The RF transceiver 100 includes an antenna 102 used to facilitate the transmission and reception of information and is coupled to a receiver 104 and a transmitter 106. A base band processor 108 is coupled to the receiver 104 and the transmitter 106 and performs standard signal processing operations to transmit and receive data. The base band processor 108 is coupled to a data modulator 114 which modulates information received from a data source 118. The base band processor 108 is also coupled to a data demodulator 116 that demodulates the information received via the antenna 102 and receiver 104 and is coupled to a data sink 120. The data source 118 delivers the information to the base band processor 108 for transmission, and the data sink 120 accepts data from the base band processor 108 upon successful data reception. To enable DTV signal detection, the base band processor 108 provides the base band receive signal to a DTV signal detector 110. The DTV signal detector 110 outputs a decision in the form of a Boolean output variable, "signal present", or "signal absent" to a controller 112.

In one embodiment of the present invention, the decision from the DTV detector is coupled to the input of the data source 118 and provides an indication to the user of the radio frequency transceiver 100 that a DTV signal is present or is absent. When the operating frequency of the transmitter 104 and the operating frequency of the receiver 106 are switchable, the user can either decide to stay on the current channel, or switch the operating frequency of the transmitter 104 and the operating frequency of the receiver 106 to select another channel.

When the operating frequency of the transmitter 104 and the operating frequency of the receiver 106 are switchable, such as that of a synthesized transmitter and a synthesized receiver, the controller 112 can control the base band processor 108 and the synthesized transmitter 104 and the synthesized receiver 106, in another embodiment of the present invention, to utilize the current channel when the output of the DTV detector 110 is "signal absent", and to tune to another channel when the output of the DTV detector 110 is "signal present".

Likewise, in yet another embodiment of the present invention, the controller 112 can control the base band processor 108, the synthesized transmitter 104 and the synthesized receiver 106 to remain locked onto the current channel, such as in signal conditions which would otherwise have not been determined to be an active channel when only a pilot tone detector or a delay-multiply detector are utilized to detect the presence of the DTV signal.

Figure 2:
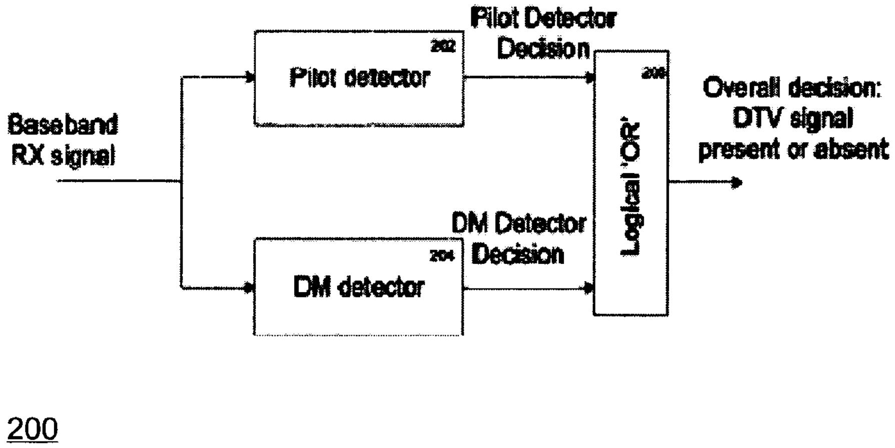
FIG. 2 is an electrical block diagram of a parallel DTV signal detector in accordance with a first embodiment of the present invention.

FIG. 2 is an electrical block diagram of a parallel DTV signal detector 200 in accordance with a first embodiment of the present invention used to enable the DTV detector 110 described above. The parallel DTV signal detector 200 includes a pilot detector 202 and a delay-multiply (DM) detector 204 which separately are well-known in the art. The pilot detector 202 and the delay-multiply detector 204 process the base band receive signal in parallel. The pilot detector 202 generates a decision as a Boolean output variable "signal present" or "signal absent". Delay-multiply detector 204 generates a decision also as a Boolean output variable "signal present" or "signal absent". The pilot detector decision and the DM detector decision are coupled to a logical OR circuit 206, which generate an overall decision as to whether a DTV signal is absent or present.

Figure 3:
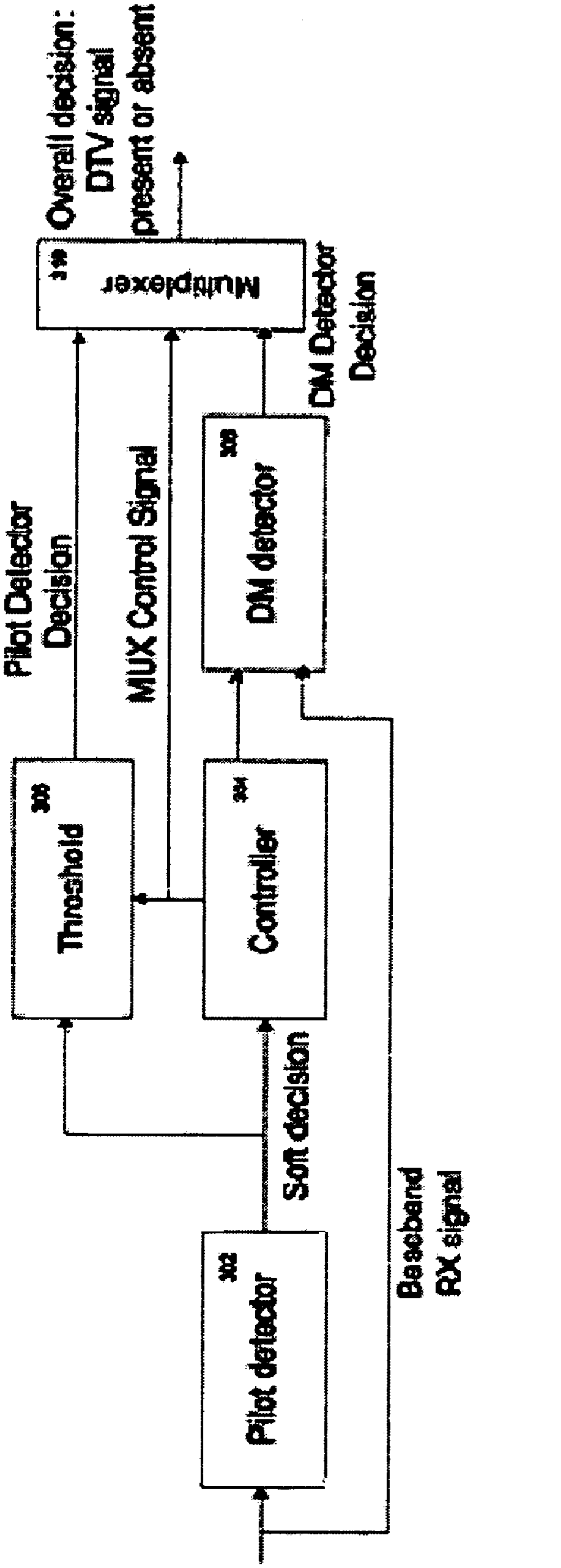
FIG. 3 is an electrical block diagram of a serial DTV signal detector in accordance with a second embodiment of the present invention.

FIG. 3 is an electrical block diagram of a serial DTV signal detector 300 in accordance with a second embodiment of the present invention used to enable the DTV detector 110 described above. The base band receive signal is processed by the pilot detector 302. The pilot detector 302 is coupled to and provides a soft decision output to a controller 304 and a threshold detector 306. The base band receive signal is also coupled to and processed by a delay-multiply detector 308. One possible soft decision output is an absolute value of the received power measured by the pilot detector 302. Other metrics conveying the reliability of the decision made by the pilot detector 302 can also be used to determine the soft decision output. When the soft decision output of the pilot detector 302 is detected as being reliable by the threshold detector 306, a MUX control signal is generated that is coupled to the controller 304. The controller 304 generates a signal that disables the delay-multiply detector, and the pilot detector 302 outputs a Boolean output "signal present" or "signal absent" that is coupled to a multiplexer 310. The multiplexer 310 selects the pilot detector 302 decision to be the final decision. On the other hand, when the decision of the pilot detector 302 is determined to be unreliable by the threshold detector 306, a signal is sent to the controller to enable the delay-multiply detector 308. The delay-multiply detector 308 then processes the base band receive signal and outputs a Boolean output "signal present" or " signal absent" to the multiplexer 310. The multiplexer 310 selects the delay-multiply detector 308 output to be the final decision.

Figure 4:
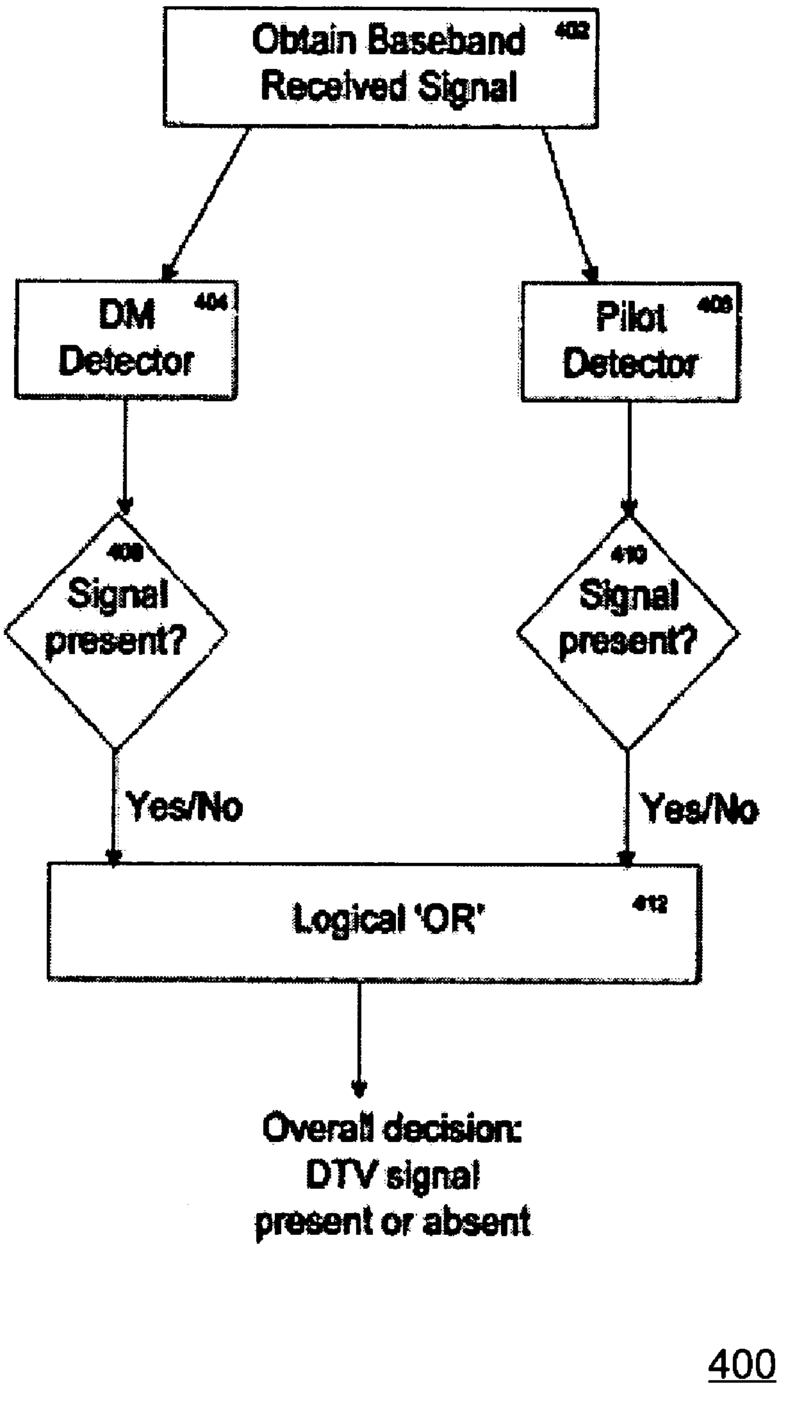
FIG. 4 is a flow chart presenting the operation of the parallel DTV signal detector of FIG. 2.

FIG. 4 is a flowchart illustrating the operation of the parallel DTV signal detector 200 of FIG. 2. The base band receive signal is obtained at 402 from the base band processor 108. The base band receive signal is processed in the parallel DTV detector 200 by the pilot detector 202 at 406 and the delay-multiply detector 204 at 404. The pilot detector 202 and the delay-multiply detector 204 generate Boolean output "signal present" or "signal absent" decisions at 410 and 408, respectively. A logical 'OR' operation, at 412, is performed on the outputs of the pilot detector 202 and delay-multiply detector 204 to determine whether a DTV signal is present or absent, and as a result whether the current channel being received is to be maintained or a different channel selected.

Figure 5:
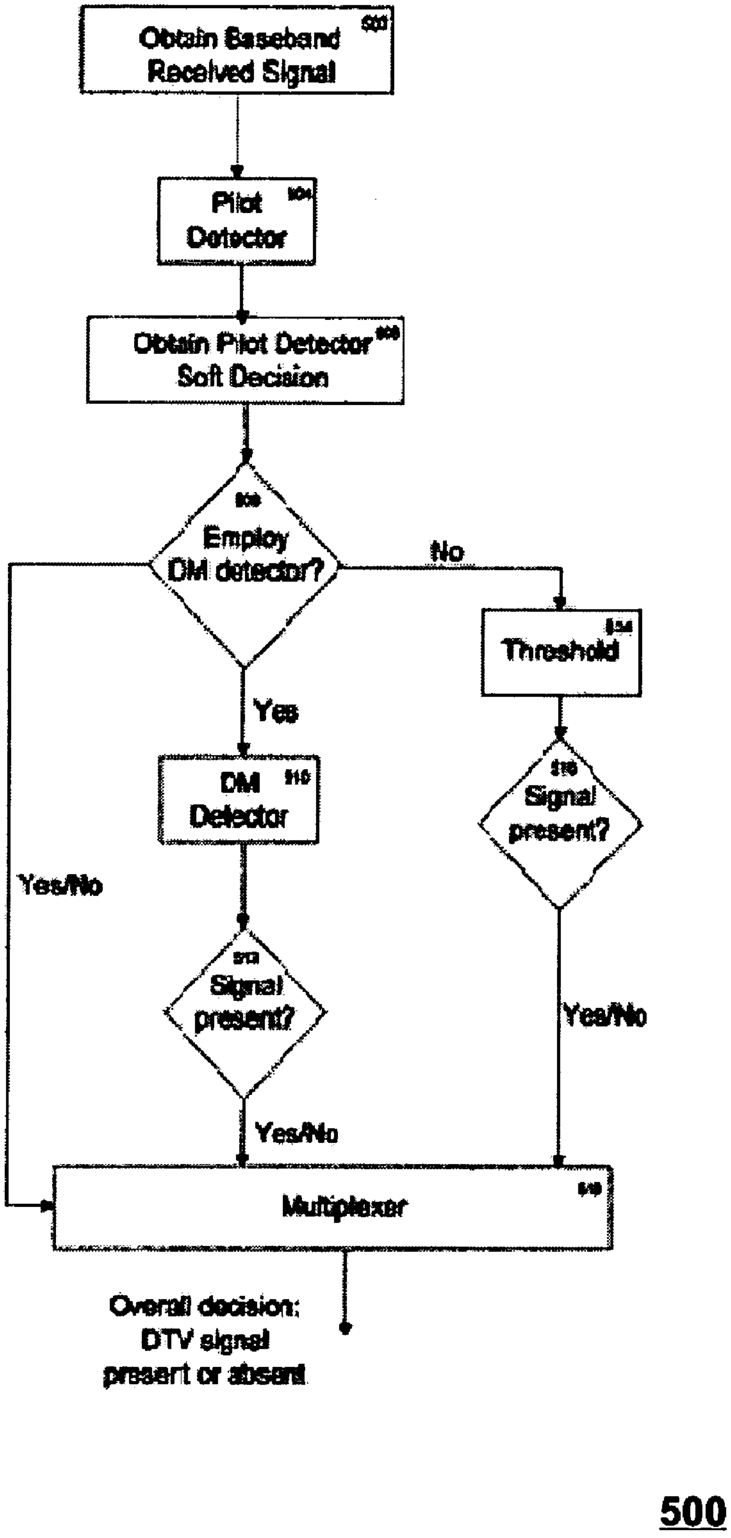
FIG. 5 is a flow chart presenting the operation of the serial DTV signal detector of FIG. 3

FIG. 5 is a flowchart illustrating the operation of the serial DTV signal detector 300 of FIG. 3. The base band receive signal is obtained at 502 from the base band processor 108. The base band receive signal is processed by the serial DTV detector 300, first by the pilot detector 302 at 504. The pilot detector 302 outputs a soft decision at 506 that is used to determine whether or not to employ the delay-multiply detector 308 at 508. When the soft decision at 506 is determined not to employ the delay-multiply detector 308, the receive signal strength as determined by threshold detector 306 at 514 is used to generate a decision whether a DTV signal is present or absent at 516. When a signal is determined to be present or absent at 516 based solely on the soft decision output of the pilot detector 302, the soft decision is outputted indicating the presence or absence of a DTV signal by the multiplexer 310 at 518. When the soft decision in 506 determines to employ the delay-multiply detector 308, at 508, the delay-multiply detector 308 is enabled by the controller 304 to process the base band receive signal in 510, whereupon the signal is deemed present or absent based on the output of the delay-multiply detector in 512. The multiplexer 310 then selects the output of the delay-multiply detector at 518, indicating whether the current channel being received is to be maintained or a different channel selected.

Figure 6:
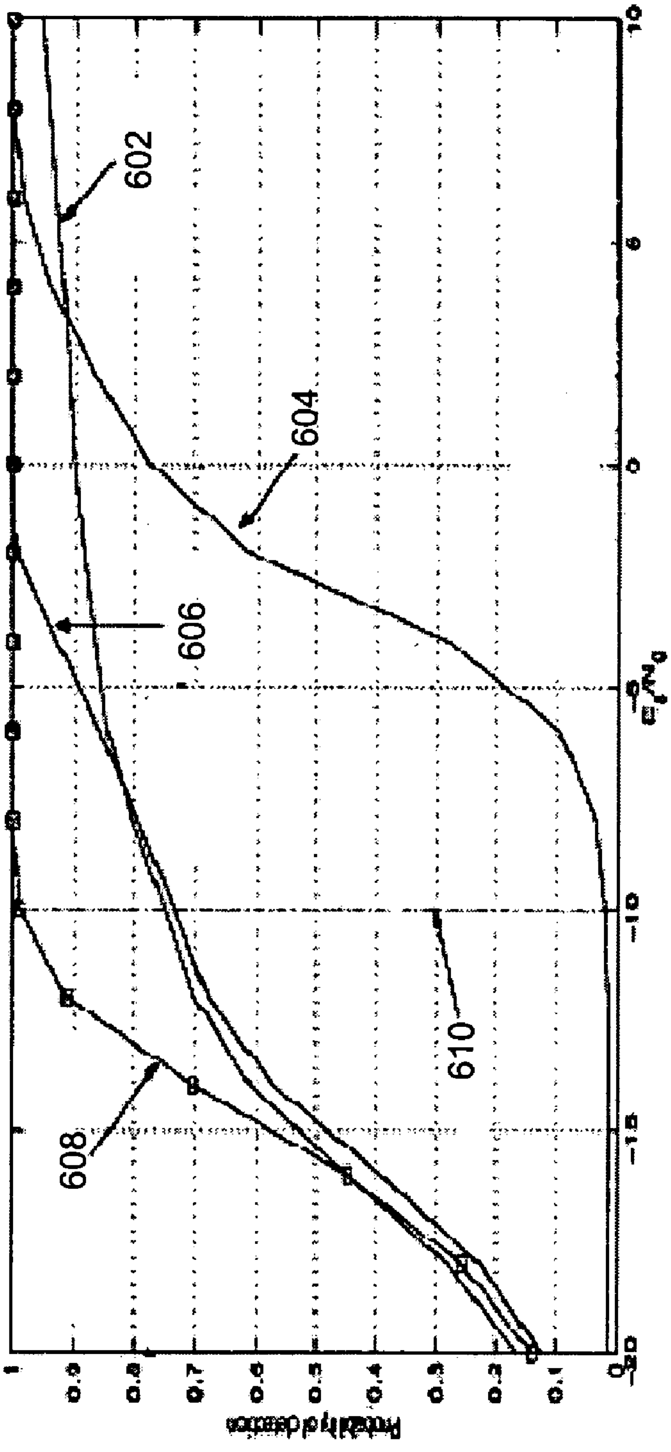
FIG. 6 is a graph presenting a comparison of the detection probability improvement obtain using the parallel DTV signal detector in accordance with the first embodiment of the present invention.

FIG. 6 is a graph presenting a comparison of the detection probability improvement obtained using the parallel DTV signal detector 200 in accordance with the first embodiment of the present invention. The performance of the parallel DTV signal detector 200 is shown as curve 606 in FIG. 6 which displays the average probability of detection, that is, the probability that the detector output is "signal present" given that the signal is present in actuality, versus the signal-to-noise ratio (SNR) at the synthesized receiver 106. The performance of the parallel DTV signal detector 200 is shown for a multi-path fading channel. For reference, the individual performance of the pilot detector 202 and delay-multiply detector 204 is shown in the multi-path fading channel as curves 602 and 604, respectively. For further reference, the performance of the pilot detector in an Additive White Gaussian Noise (AWGN) channel is shown as curve 608. Ideally, it is desirable to obtain a probability of detection for a DTV detector to be as close as possible to unity for the widest possible range of SNR values. As evident from curve 608 for an AWGN channel, the pilot detector 202 does attain a probability of detection close to unity for all SNRs above minus 10 dB. However, in the multi-path fading channel, the performance of the pilot detector 202 is seriously degraded in that the probability of detection is less than 0.95 for the entire SNR range displayed in FIG. 6. The performance of the delay-multiply detector in the multi-path fading channel is acceptable only for the SNRs above roughly 7 dB. On the other hand, the combination of both the pilot detector 202 and the delay-multiply detector 204 in parallel exhibits a superior performance in the multi-path fading channel as shown by curve 606, with the probability of detection close to unity for all SNRs above roughly minus 2 dB.

As described above, a number of proposals have been made to allow the use of the unused channels of the VHF/UHF TV spectrum between 54 MHz and 862 MHz by unlicensed devices, provided that the unlicensed users do not create harmful interference to the incumbent users of the spectrum. It is envisioned that unlicensed devices will possess the capability to autonomously identify channels within licensed television bands where they may transmit without creating harmful interference. The present invention deals with the problem of detection and identification of licensed Digital Television (DTV) transmissions for the purpose of determining whether or not an unlicensed device may share a particular television channel. As described above, the DTV waveform includes a strong pilot tone (relative to the power spectral density of the DTV signal) that could be used for detection of DTV transmissions in AWGN channels. However, in frequency selective fading channels, a frequency null can occur at the pilot signal frequency, leading a pilot detector to erroneously conclude that the channel is not utilized by a licensed TV service.

In accordance with the several embodiments of the present invention described above, the DTV detector is shown to be more robust against frequency selective fading. The DTV detector is based on the combination of the pilot detector and the delay-multiply detector placed either in parallel or serially. The delay-multiply detector searches for the baud-rate spectral line in the delay-multiplied waveform and therefore is not susceptible to the deleterious effects of frequency selective fading at the pilot signal frequency. The delay-multiply detector is only affected by fading at high-end frequencies of the TV channel, whereas the pilot signal is placed at a low-end frequency. Hence, by combining both the pilot and delay-multiply detectors as described in accordance with the several embodiments of the present invention, the vulnerability of the pilot detector in frequency selective fading channels is largely eliminated. Numerical results are presented below and illustrated in FIG. 6 comparing the performance of the pilot detector, the delay-multiply detector, and a parallel combination of the pilot detector and the delay-multiply detector in accordance with the first embodiment of the present invention. The performance of the detectors is characterized in terms of the average probability of detection, where the average is computed with respect to multi-path channel realizations.

The issue of spectrum sensing in frequency-selective fading channels is described below. The base band channel model for this numerical study is described as:

$$h(t)=\frac{1}{\sqrt{2}}\delta(t)+e^{j\Theta}\times\frac{1}{\sqrt{2}}\delta(t-\tau) \tag{1}$$

where $\Theta$ is a uniformly distributed random variable on $[0\ 2\pi]$, and the channel is normalized for unit energy. Note that if the DTV pilot tone is placed at DC during conversion to base band, then $\Theta=-\pi$ results in complete nulling of the pilot tone. The output SNRs of the pilot detector and the delay-multiply detector are functions of $\Theta$ and denoted as $SNR_p(\Theta)$ and $SNR_{DM}(\Theta)$, respectively. For these numerical results, $SNR_p(\Theta)$ and $SNR_{DM}(\Theta)$ were determined semi-analytically via simulations that attempt to closely model the DTV transmit waveform.

For a given realization of $\Theta$, the probability of miss for the pilot detector and the delay-multiply detector is given by:

$$P_{miss}(\Theta)=F_{\chi^2,2M,\alpha,non\text{-}central}(T) \tag{2}$$

where T is the detection threshold, $\alpha=2M\times SNR_p(\Theta)$ and $\alpha=2M\times SNR_{DM}(\Theta)$ for the pilot detector and delay-multiply detector, respectively. In (2), $F_{\chi^2,2M,\alpha,non\text{-}central}(x)$ denotes the CDF of a non-central chi-square random variable with 2M degrees of freedom and non-centrality parameter $\alpha$. For this numerical study, it is assumed that M=1. The average probability of miss for both detectors is obtained by averaging the expressions in (2) with respect to $\Theta$. Note that the probability of a false alarm, $P_f$, is only a function of the background noise and hence does not depend on $\Theta$.

The average probabilities of detection (one minus probabilities of miss) for both detectors are displayed in FIG. 6 as described above. For these results, the detection threshold was set for both detectors to obtain false alarm probability $P_f=0.01$. It is assumed that both detectors have the same post-detection bandwidth. The bandwidth was determined to obtain $P_{miss}=0.01$ for the pilot detector in AWGN channel at input $E_s/N_0=-10$ dB. As evident from the curves of FIG. 6, relative to its performance in AWGN, the performance of the pilot detector in the multi-path channel is seriously degraded. In fact, the pilot detector appears to be multi-path fading-limited, in that it is unable to reach probability of detection arbitrarily close to unity even at high desired signal levels. Conversely, the delay-multiply detector is not multi-path fading-limited and reaches probability of detection close to unity at high desired signal levels. However, it performs significantly worse relative to the pilot detector at low and moderate desired signal levels.

To obtain satisfactory performance for all ranges of input SNR, a DTV detection structure with pilot detector and delay-multiply detector in parallel was described above. The spectrum is considered vacant if neither the pilot detector nor the delay-multiply detector senses a TV transmission. The parallel DTV signal detector attains probability of detection close to unity at lower desired signal levels then the delay-multiply detector alone, and, at the same time, follows the performance of the pilot detector at low desired input signal levels. Note that, for the same detection threshold, the probability of a false alarm for the parallel DTV signal detector is slightly higher then that of the pilot detector or the delay-multiply detector. To obtain $P_f=0.01$ for the parallel DTV signal detector, the detection threshold was slightly raised, which resulted in a small degradation in probability of detection relative to the pilot detector at low desired input signal levels. Overall, the parallel DTV signal detector in accordance with the present invention significantly improves the reliability of spectrum sensing for identifying vacant DTV channels.

Figure 7:
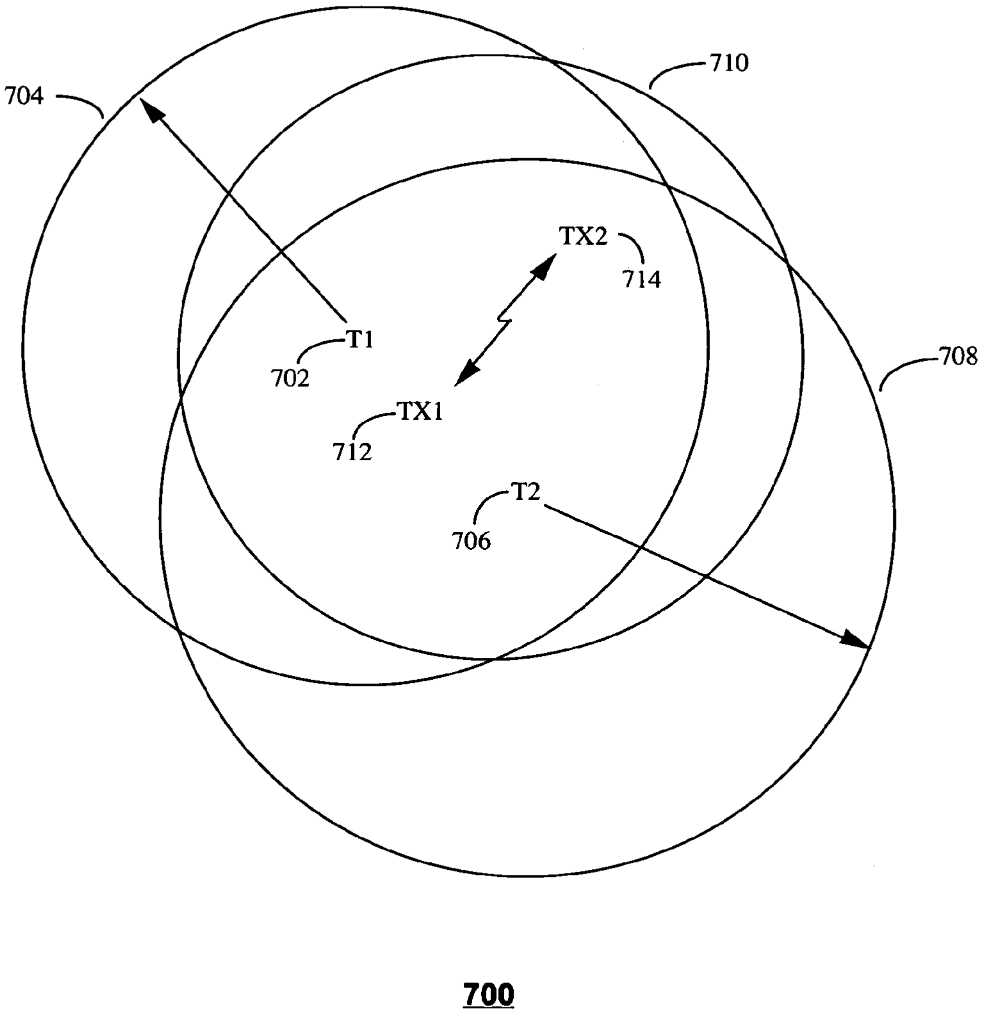
FIG. 7 is a diagram depicting coverage areas provided by active TV channels and a coverage area provided by a Wide Regional Area Network using an inactive TV channel.

FIG. 7 is a diagram depicting coverage areas provided by active TV channels and a coverage area provided by a Wide Regional Area Network using an inactive TV channel. A first television station depicted by transmitter T1 702 provides a coverage area depicted by circle 704. A second television station depicted by transmitter T2 706 provides a coverage area depicted by circle 708. As is common in many metropolitan areas, the coverage areas of different television stations overlap as they are attempting to reach the same viewing audience. The coverage areas deviate due in part to transmitter location, transmitter power, antenna height, terrain, and other parameters affecting signal propagation. Also shown in FIG. 7 is the coverage area 710 that would be provided by unlicensed communication devices utilizing an inactive TV channel in a typical Wide Regional Area Network. Depending upon the unlicensed system configuration, this coverage area could be greater than or less than the coverage area provided by the active TV channels. As shown, a first transceiver TX1 712 is communicating to a second transceiver TX2 714. The first transceiver TX1 712 could be a fixed transceiver, a base station providing Wide Regional Area Network coverage, or a mobile transceiver. Likewise the second transceiver TX2 714 could be a fixed transceiver, a base station providing a Wide Regional Area Network extended coverage, or a mobile transceiver. The transmission of information between the communication devices, such as first transceiver TX1 712 and second transceiver TX2 714 operating in accordance with the present invention is illustrated by the coverage area for the Wide Regional Area Network depicted by circle 710. As an example, transceiver TX1 712 can be a base station providing Internet connectivity to a mobile transceiver TX2 714, or transceiver TX2 714 can be a fixed transceiver, such as one located in a home or business to provide the same Internet connectivity. It will be appreciated that in a communication system as shown and described in FIG. 7, it is important that the unlicensed devices operating in this communication system are operating on inactive TV channels, otherwise interference with local customers of the active TV channels will occur.

While the embodiments of the present invention are directed primarily to detecting inactive TV channels by detecting the absence of a pilot tone and the baud rate spectral line in the delay-multiplied signal, it will be appreciated that the same DTV signal detector in accordance with the present invention can be utilized to lock onto active TV channels that might otherwise be missed by prior art DTV signal detectors, such as in situations where TV reception quality would be marginal.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

We claim:

1. A communication device for use in a digital television (DTV) system, comprising:

a receiver that is operable to receive digital television (DTV) signals on a selected DTV channel;

a transmitter operable to transmit radio communication information on a DTV channel;

a base band processor coupled to the receiver and transmitter, the base band processor operable to process received DTV signals;

a DTV signal detector coupled to the processor, the DTV signal detector operable to detect received DTV signals and to detect that the DTV signal is absent by the following function:

$$F_{\chi^2,2M,\alpha,non\text{-}central}(T)$$

where T is a detection threshold, and F denotes the cumulative distribution function of a non-central chi-square ($\chi^2$) random variable with 2M degrees of freedom and non-centrality parameter, $\alpha$=2M (SNR) for the signal-to-noise ratio of either a pilot signal detector or a delay-multiply detector; and a controller, responsive to the DTV signal detector, to control a selection of a DTV channel to be used by the transmitter, wherein if said DTV signal detector detects that a DTV signal is absent on the selected DTV channel, the controller can direct the transmitter to transmit information on that selected DTV channel.

2. The communication device according to claim 1, wherein said DTV detector comprises a pilot signal detector that detects the presence of a pilot signal in the DTV signal and a delay-multiply detector that detects the presence of a baud-rate spectral line in the DTV signal.

3. The communication device according to claim 2, wherein said pilot signal detector and delay-multiply detector operate in parallel such that the presence of the DTV signal in the DTV channel can be confirmed to the controller be either of the pilot signal detector and delay-multiply detector.

4. The communication device according to claim 2, wherein said pilot signal detector and delay-multiply detector operate serially such that if the controller deems that the pilot signal detector is unreliable, the controller accepts a determination of DTV signal presence from the delay-multiply detector.

5. The communication device according to claim 1, wherein said controller selects a different DTV channel to be used by said transmitter when said DTV detector detects that the DTV signal is present on the selected DTV channel.

6. A DTV detector, comprising:

a pilot signal detector coupled to a receiver for detecting the presence of a pilot signal in a received DTV signal on a selected DTV channel and generating in response thereto a first decision output therefrom and to detect that the DTV signal is absent by the following function:

$$F_{\chi^2,2M,\alpha,non\text{-}central}(T)$$

where T is a detection threshold, and F denotes the cumulative distribution function of a non-central chi-square ($\chi^2$) random variable with 2M degrees of freedom and non-centrality parameter, $\alpha$=2M(SNR) for the signal-to-noise ratio of the pilot signal detector;

a delay-multiply detector also coupled to said receiver for detecting the presence of a baud-rate spectral line in the received DTV signal on the selected DTV channel and generating in response thereto a second decision output therefrom and to detect that the DTV signal is absent by the following function:

$$F_{\chi^2,2M,\alpha,non\text{-}central}(T)$$

where T is a detection threshold, and F denotes the cumulative distribution function of a non-central chi-square ($\chi^2$) random variable with 2M degrees of freedom and non-centrality parameter, $\alpha$=2M(SNR) for the signal-to-noise ratio of the delay-multiply detector;

a logical decision element coupled to said pilot signal detector and said delay-multiply detector, and responsive to the first decision output and the second decision output for determining that a DTV signal is being received, wherein if either decision output indicates that a DTV signal is absent on the selected DTV channel, the logical decision element can direct the transmission of radio communication information on that selected DTV channel.

7. The DTV detector according to claim 6, wherein said receiver is a synthesized receiver, and wherein the logic decision element selects a different DTV channel to be used for radio communication information transmissions when either DTV detector detects that the DTV signal is present.

8. A DTV detector, comprising:

a pilot signal detector coupled to a receiver for detecting the presence of a pilot signal in a received DTV signal on a selected DTV channel and to detect that the DTV signal is absent by the following function:

$$F_{\chi^2,2M,\alpha,non\text{-}central}(T)$$

where T is a detection threshold, and F denotes the cumulative distribution function of a non-central chi-sciuare ($\chi^2$) random variable with 2M degrees of freedom and non-centrality parameter, $\alpha$=2M(SNR) for the signal-to-noise ratio of the pilot signal detector, and generating in response thereto a first decision output there from;

a controller that is responsive to said pilot signal detector for enabling operation of a second DTV detector;

a delay-multiply detector also coupled to said receiver for detecting the presence of a baud-rate spectral line in the received DTV signal on the selected DTV channel and to detect that the DTV signal is absent by the following function:

$$F_{\chi^2,2M,\alpha,non\text{-}central}(T)$$

where T is a detection threshold, and F denotes the cumulative distribution function of a non-central chi-square ($\chi^2$) random variable with 2M degrees of freedom and non-centrality parameter, $\alpha$=2M(SNR) for the signal-to-noise ratio of the delay-multiply detector, and generating in response thereto a second decision output there from;

a logical decision element coupled to said pilot signal detector and said delay-multiply detector, and responsive to the first decision output and the second decision output for determining that a DTV signal is being received, wherein if the controller deems that the first decision output is unreliable, the controller accepts a determination of DTV signal presence from the second decision output.

9. The DTV detector according to claim 8, wherein the DTV detector further comprises a threshold detector, coupled to said pilot signal detector, and responsive to the output thereof, to detect when a level of the DTV signal being received equals or exceeds a predetermined threshold DTV signal value, said threshold detector being coupled to said logical decision element for controlling a selection the first decision output and the second decision output for determining that a DTV signal is being received.

10. The DTV detector according to claim 8, wherein said receiver is a synthesized receiver, and wherein the logic decision element selects a different DTV channel to be used for radio communication information transmissions when said the logic decision element determines that the DTV signal is present.

* * * * *